(12) United States Patent
Sindalovsky et al.

(10) Patent No.: US 7,561,653 B2
(45) Date of Patent: Jul. 14, 2009

(54) METHOD AND APPARATUS FOR AUTOMATIC CLOCK ALIGNMENT

(75) Inventors: Vladimir Sindalovsky, Perkasie, PA (US); Lane A. Smith, Easton, PA (US)

(73) Assignee: Agere Systems Inc., Allentown, PA (US)

( * ) Notice: Subject to any disclaimer, the term of this patent is extended or adjusted under 35 U.S.C. 154(b) by 671 days.

(21) Appl. No.: 11/174,228

(22) Filed: Jul. 1, 2005

(65) Prior Publication Data

US 2007/0002992 A1   Jan. 4, 2007

(51) Int. Cl.
*H03D 3/24* (2006.01)
(52) U.S. Cl. ..................................... 375/373
(58) Field of Classification Search ................. 375/215, 375/294, 327, 354, 357, 369, 372, 373, 374, 375/376; 370/395.62, 507, 503; 455/180.3, 455/265, 266; 702/89; 713/375, 400; 342/103
See application file for complete search history.

(56) References Cited

U.S. PATENT DOCUMENTS 5,684,421 A   11/1997  Chapman et al.
6,539,072 B1   3/2003  Donnelly et al.
6,564,359 B2   5/2003  Saeki
2006/0220749 A1 * 10/2006  Rosik et al. .................... 331/12

* cited by examiner

*Primary Examiner*—Sam K Ahn (57) ABSTRACT

The present invention synchronizes signals generated and used in different clock domains. The invention is applicable to a CDR circuit in which phase adjustment of a multiphase clock to the phase of incoming data is implemented by controlling phase offsets from the PLL frequency relative to data sampling points $S_i$ and transition sampling points $T_i$. In particular, these offsets are controlled by both coarse and fine adjustments.

Typically CDR circuits employ feedback phase control information being supplied to the VCDL. The above described adjustments result in these phase control signals having an arbitrary and time-changing relation to the PLL clock. By properly selecting an appropriate edge of the PLL clock signal, the present invention synchronizes these phase control signals into the PLL clock domain in order to apply VCDL control in a synchronous manner.

20 Claims, 7 Drawing Sheets

METHOD AND APPARATUS FOR AUTOMATIC CLOCK ALIGNMENT

FIELD OF THE INVENTION

The present invention relates in general to synchronization of signals between different clock domains in a circuit employing a Voltage Controlled Delay Loop (VCDL) and in particular, to synchronization of phase control signals in a Clock and Data Recovery (CDR) circuit.

BACKGROUND OF THE INVENTION

Figure 1:
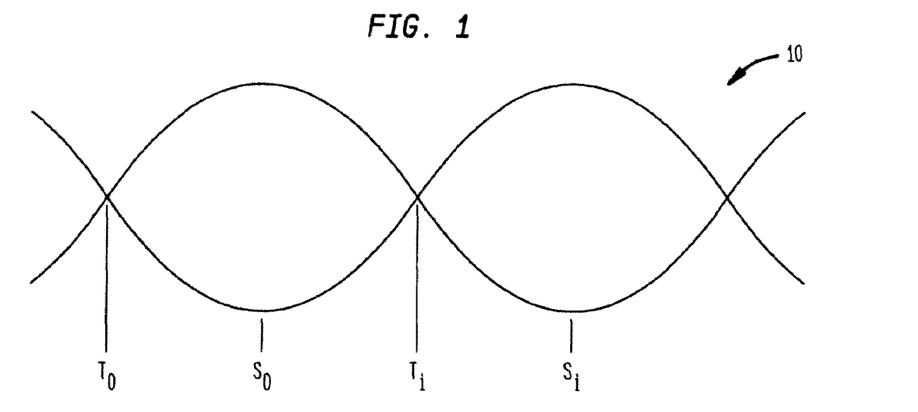
FIG. 1 illustrates proper sampling times of a received digital signal.

Currently, CDR circuits are based on timing signals provided by Delay Locked Loops (DLL) or Voltage Controlled Delay Loops (VCDL). An example of such prior art CDR circuits are described in U.S. Pat. No. 5,684,421 issued Nov. 4, 1997 to Chapman et al., which patent is hereby incorporated by reference. In a CDR system an internal clock, derived from a reference Phase-Lock Loop (PLL) clock, is used to oversample incoming data. Based on the results of this oversampled data, a recovered clock is derived by delaying the internal clock so that it provides data sampling adjusted to the center of the "eye" pattern of the received data. FIG. 1 illustrates an example of sampling of a received digital data signal 10 wherein $S_0$ and $S_1$ depict sampling times corresponding to the center of the eye pattern. As also illustrated, sampling at transition points $T_0$ and $T_1$ would not properly detect the received data, although these points are used for data phase detection.

Figure 2:
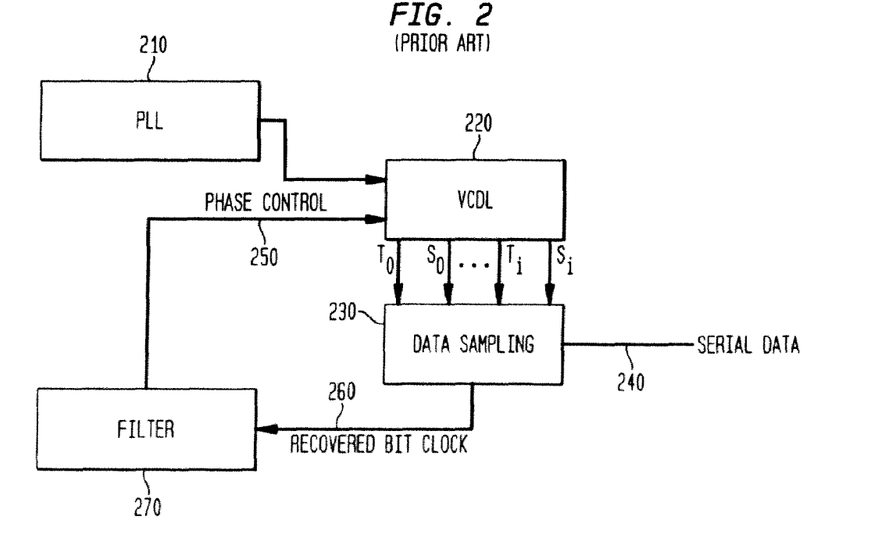
FIG. 2 is a block diagram of a conventional CDR circuit.

FIG. 2 is a block diagram of a conventional CDR system in which a VCDL component 220 is used to generate multiphase clock signals for a data sampler 230 for sampling serial data 240. In such a VCDL component, the phases of this multiphase clock need to be constantly adjusted to the phase deviations of the incoming data. As proper sampling of the serial data occurs, a Recovered Bit Clock 260 is derived which corresponds in timing (phase and frequency) to the serial data signal. This Recovered Bit Clock 260 is supplied to a filter (e.g., a second order PI filter, as is well-known) which produces a Phase Control Signal 250 which is supplied back to the VCDL component 220. This Phase Control Signal 250 comprises feedback information on adjusting the phase of the multiphase clocks. For example, this signal may comprise instructions that the phase needs to be increased by a fixed amount, decreased by a fixed amount, or left unchanged.

A problem exists in the prior art in that this Phase Control Signal 250 is in the recovered clock domain while the VCDL component operates in the PLL clock domain. That is, the Phase Control Signal 250 is derived and consequently changes as a function of the recovered clock timing. This recovered clock is independent and potentially changing its relation in time to the PLL clock. For the VCDL circuitry to properly utilize the information in this Phase Control Signal, synchronization of this signal relative to the PLL clock needs to be performed.

SUMMARY OF THE INVENTION

The present invention synchronizes signals generated and used in different clock domains. The invention is applicable to a CDR circuit in which phase adjustment of a multiphase clock to the phase of incoming data is implemented by controlling phase offsets from the PLL frequency relative to data sampling points $S_i$ and transition sampling points $T_i$. In particular, these offsets are controlled by both coarse and fine adjustments.

Typically CDR circuits employ feedback phase control information supplied to the VCDL. The above described adjustments result in these phase control signals having an arbitrary and time-changing relation to the PLL clock. By properly selecting an appropriate edge of the PLL clock signal as the sampling edge, the present invention synchronizes these phase control signals into the PLL clock domain in order to apply VCDL control in a synchronous manner.

BRIEF DESCRIPTION OF THE DRAWINGS

Various embodiments of the present invention will now be described in detail in conjunction with the annexed drawings, in which.

DETAILED DESCRIPTION

Figure 3:
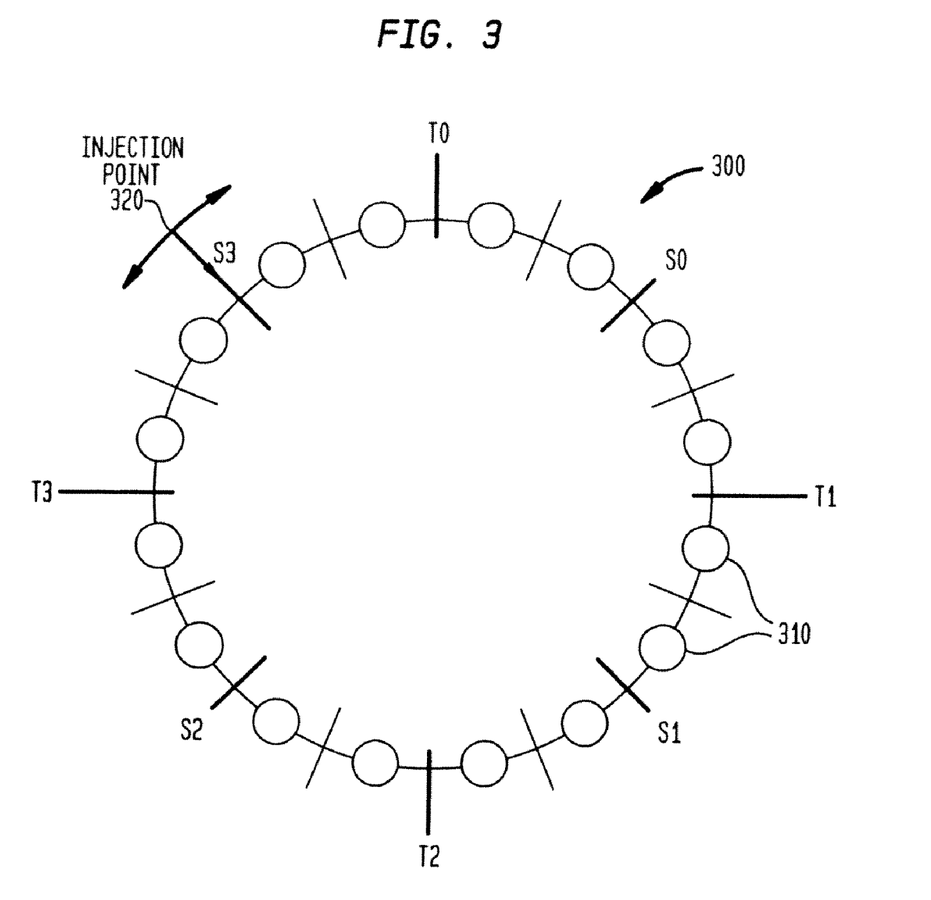
FIG. 3 illustrates VCDL phase control according to an embodiment of the invention.

The present invention is intended for use in a system in which a sampling clock is derived using a VCDL multiphase clock. FIG. 3 illustrates an exemplary multiphase clock wherein various phase delays or stages are depicted in a circular arrangement. The labeling convention of these stages correlates to that of FIG. 1. Items labeled 310 represent delay elements that are used to create a multiphase data sampling clock.

S3 is depicted as the current Injection Point 320 at which the PLL frequency is supplied. Coarse adjustments to these multiphase clocks are obtained by shifting this injection point 320. Fine adjustments are attained by using a central interpolator 330. The use of an injection point control in this manner is described in co-pending U.S. patent application Ser. No. 10/999,900 entitled "Delay Line with Injection Point Control", the contents of which are hereby incorporated by reference. The use of a central interpolator is described in co-pending U.S. patent application Ser. No. 10/999,889 entitled "Central Interpolator", the contents of which are also hereby incorporated by reference.

As described above, coarse phase adjustments to this multiphase clock are performed by varying the injection point 320 of the PLL frequency. The location of the injection point 320 can be coded into one of four quadrants: quadrant 1 (Q1)—from T0 to T1, quadrant 2 (Q2)—from T1 to T2, quadrant 3 (Q3)—from T2 to T3, and quadrant 4 (Q4)—from T3 to T0. Within each quadrant there are four possible injection points, each incorporating a delay element 301.

When the injection point 320 of the PLL frequency is moved, the phase relations between the PLL clock and the recovered clock are changed. As depicted in FIG. 2, a phase control signal 250 is derived based on the recovered clock 260. As described herein, this phase control signal provides phase control adjustment information to VCDL 220. This information essentially comprises instructions to increase, decrease or retain the current phase delay.

Figure 4:
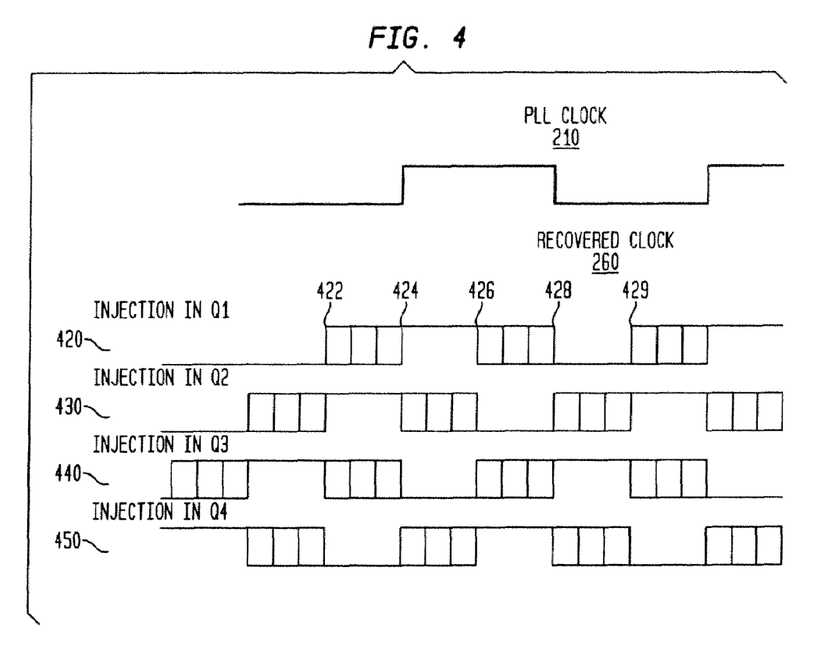
FIG. 4 illustrates exemplary phase relationships between the PLL clock signal and the recovered clock according to an embodiment of the invention.

FIG. 4 depicts the corresponding phase relationships between the PLL clock signal 210 and various potential recovered bit clocks 260 in FIG. 2. That is, FIG. 4 illustrates possible phases of the multiphase clock 300 from which a recovered bit clock 260 is derived. Referring to depicted signal 420 (which occurs when the injection point is in Q1), a leading edge of the recovered clock occurs as early as 422 and as late as 424, as a function of which injection point is used within the quadrant. Trailing edges 426 and 428, respectively, occur subsequent to the leading edge in accordance with the clock period. Leading edge 429 depicts a second cycle of the recovered clock signal 420.

Signal 430 illustrates timing of leading and trailing edges which result from an injection point occurring in Q2. As illustrated in FIG. 4, the timing of leading and trailing edges of a recovered clock 260 relative to the PLL clock 210 are determined by the quadrant in which the injection point occurs.

As described above with respect to FIG. 2, the phase control signal 250 is supplied to the VCDL 220. This signal comprises instructions to increase, decrease or retain the current phase delay of the multiphase clock. The phase control signal 250 exists in the recovered clock domain. As a result, the phase relation between the phase control signal 250 and the PLL clock 210 is changing as a function of the injection point—in the same manner as depicted in FIG. 4 with respect to the Recovered Clock 260. Consequently in order for VCDL 220, operating in the PLL clock domain, to properly obtain the phase delay adjustment instructions contained in the phase control signal 250, synchronization of the phase control signal relative to the PLL clock needs to be performed. FIG. 4's timing diagram of these signals relative to each other illustrates a means for performing this synchronization that is implemented in various embodiments of the invention described below. Rising and falling edges of the PLL clock are depicted relative in time to the potential recovered clock signals for each of the four quadrants in which the injection point can occur. For any given quadrant, either a rising edge or a falling edge of the PLL clock (but not both) can be used to synchronize a signal in the recovered clock domain.

Figure 5:
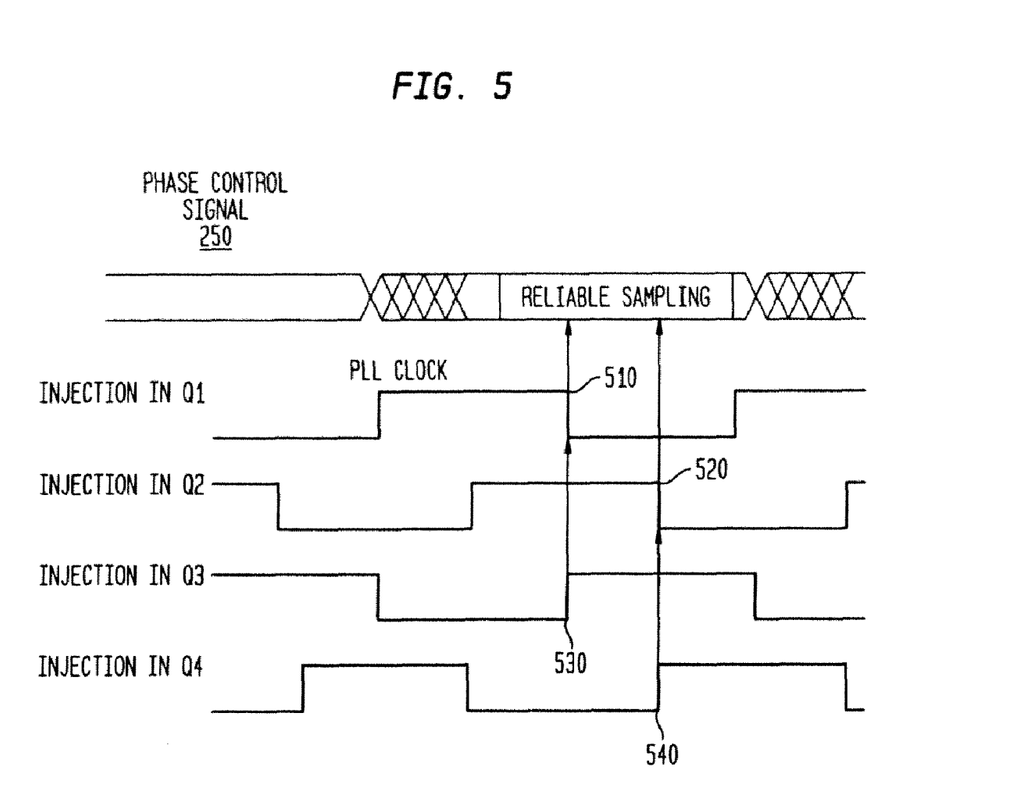
FIG. 5 is a timing diagram of potential sampling points relative to different injection quadrants.

FIG. 5 further illustrates the timing relationship between the phase control signal 250 (in the recovered clock domain) relative to the PLL clock. In particular, it illustrates the phase control signal 250 relative to the PLL clock for each of the different injection quadrants. In this figure, the phase control signal 250 is depicted as being fixed against the illustrated PLL clocks in the respective quadrants. As illustrated, to attain reliable sampling of the phase control signal 250, the falling edges of the PLL clock can be used if the injection point is in quadrants 1 or 2 (e.g., 510 and 520, respectively). The rising edge can be used if the injection point is in quadrants 3 or 4 (e.g., 530 and 540, respectively).

The propagation time for phase control signals with respect to the PLL clock can cause an additional skew between these signals. This skew may be dependent on the particular characteristics of the manufactured integrated circuit. Accordingly, it is frequently desirable to control which edge (rising or falling) of the PLL frequency is used for phase control sampling in each injection quadrant. In a further embodiment of the invention this is controlled by setting configuration bits to define which edge to employ. As a consequence, the synchronization of phase control signals into the PLL clock domain is performed more reliably.

Figure 6A:
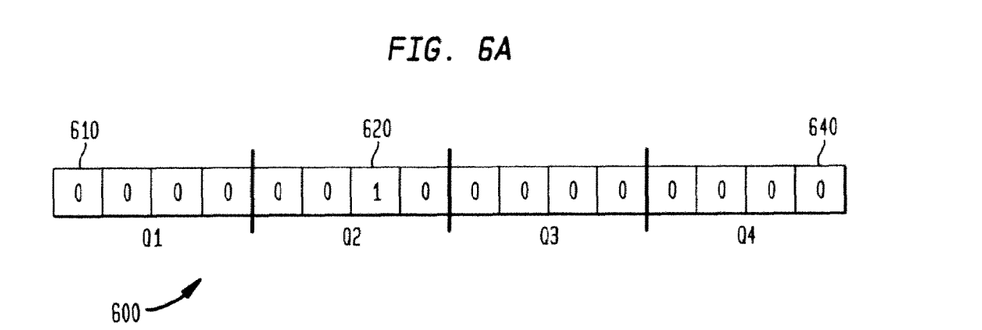
FIG. 6A depicts an exemplary injection point control register.

FIG. 6A illustrates a 16-bit shift register 600 which is used to control the injection point of the multiphase clock depicted in FIG. 3. In one embodiment, this register resides in the VCDL component 220 and has a single bit (e.g. 610) indicating the position of the injection point. Shifting this bit position up or down corresponds to a shift in the injection point. A wrap-around function permits shifting up from bit position 640 to bit position 610 (as would shifting down from bit position 610 yield bit position 640). As illustrated in FIG. 6A, the injection point quadrant is readily determined by the bit position in the register 600.

Figure 6B:
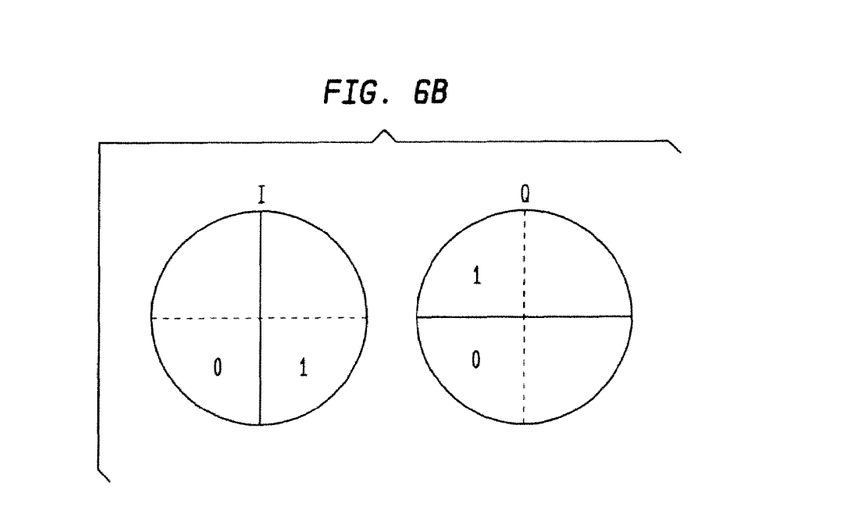
FIG. 6B illustrates a decoding scheme of the injection point in VCDL phase control according to an additional embodiment of the invention.

FIG. 6B illustrates a decoding scheme for setting "I" (in-phase) and "Q" (quadrature) flags based on the quadrant in which the injection point occurs. If the injection point is located in quadrants 1 or 2 then the decoder output "I" (in-phase) is a one, otherwise it is a zero. If the injection point is in quadrants 4 or 1, then the decoder output "Q" (quadrature) is a one, otherwise it is a zero.

Figure 7:
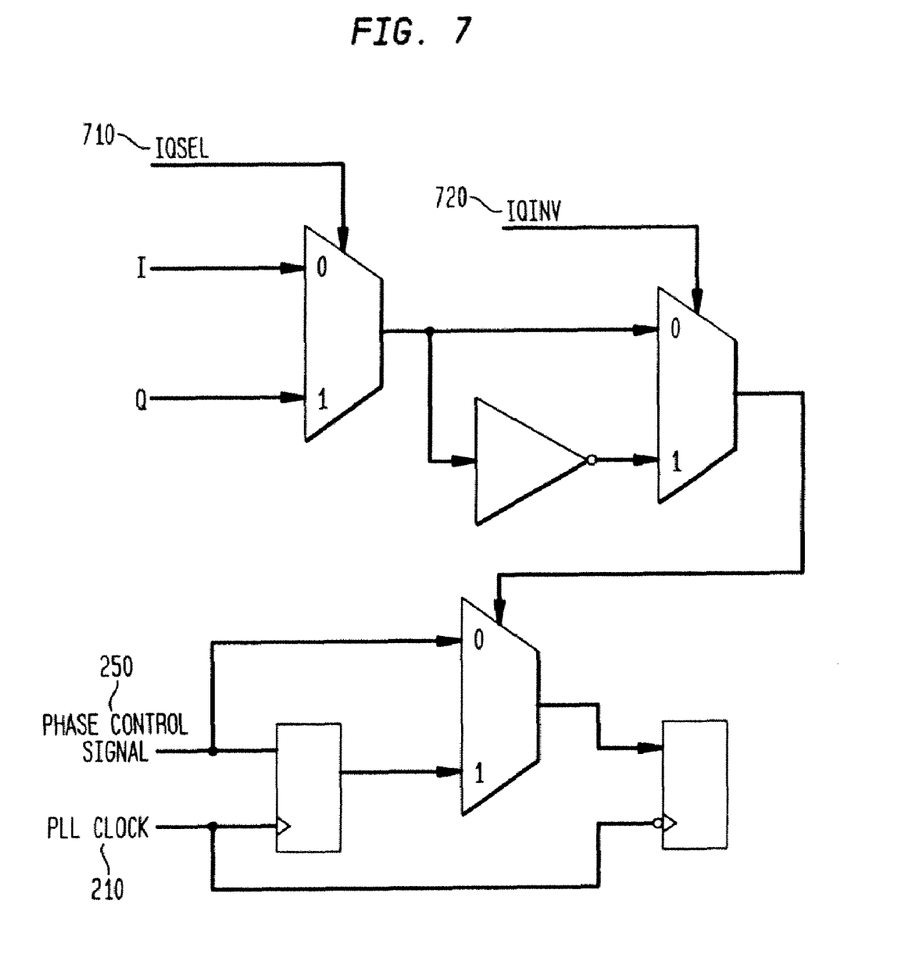
FIG. 7 depicts an exemplary control circuit for sampling edge control of an embodiment of the invention.

These I and Q flags are used for controlling the PLL edge to be employed by the control circuit depicted in FIG. 7. This control circuit uses two configuration bits, which can be changed under software control: IQSEL 710 (choosing between in-phase and quadrature decoder outputs) and IQINV 720 (allowing to invert the edge being used for synchronization). In operation, the control circuit of FIG. 7 results in the sampling control being configured to latch the phase control signal 250 on different edges of the PLL clock in each injection quadrant according to the following table:

| Setting | | PLL Clock Edge | | | |
|---|---|---|---|---|---|
| Scenario | | Quadrant | | | |
| IQINV | IQSEL | 1 | Quadrant 2 | Quadrant 3 | Quadrant 4 |
| 0 | 0 | Rising | Rising | Falling | Falling |
| 0 | 1 | Rising | Falling | Falling | Rising |
| 1 | 0 | Falling | Falling | Rising | Rising |
| 1 | 1 | Falling | Rising | Rising | Falling |

For the sake of comparison, the configuration of IQINV=1 and IQSEL=0 yields the "falling", "falling", "rising", "rising" sampling points determined in the previous embodiment of the invention and illustrated in FIG. 5. The current embodiment takes into account potential propagation delay skew for different corners of IC manufacturing process. The use of the configuration settings can satisfy any systematic skew between the phase control signals 250 and the PLL clock 210, and maintain the acceptable setup and hold requirements for the changing phase relations between the recovered clock and the PLL clock. In further embodiments of the invention, these configuration settings can be set to default values based on pre-characterization of the circuitry and/or adjusted by a user through a trial and error process.

Figure 8:
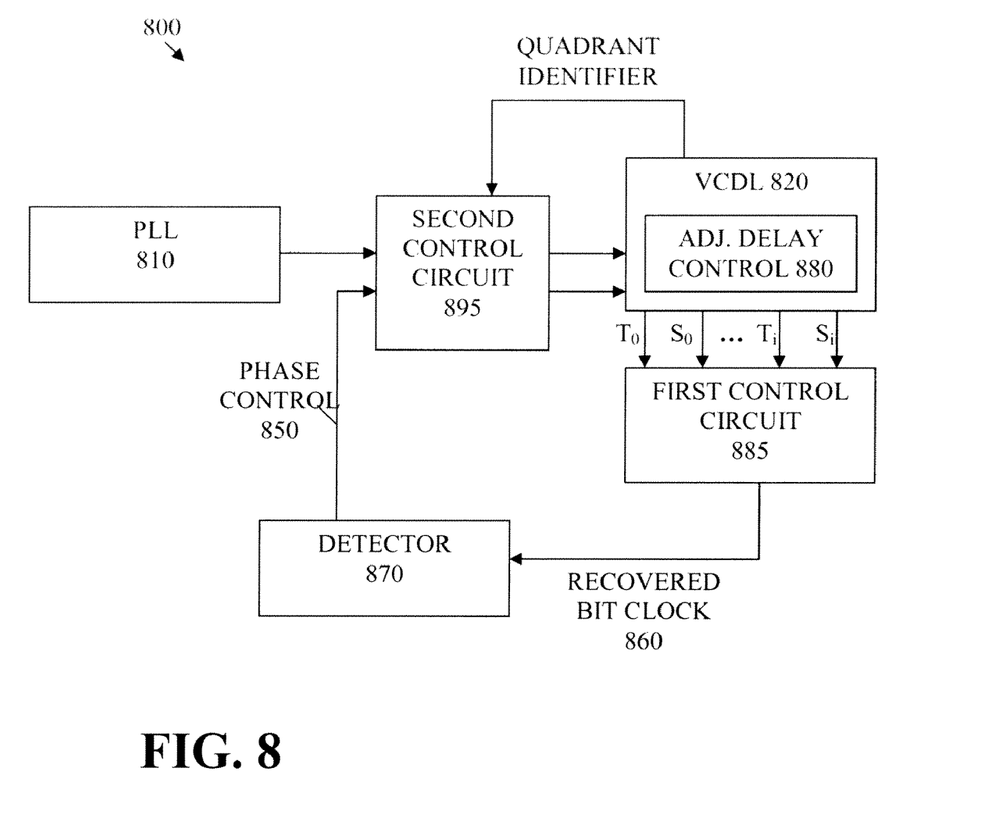
FIG. 8 illustrates a CDR circuit in accordance with the present invention.

FIG. 8 illustrates a CDR circuit 800 in accordance with the present invention. A VCDL component 820 is used to generate multiphase clock signals, in a similar manner to FIG. 2. As indicated above, in such a VCDL component 820, the phases of this multiphase clock need to be adjusted to the phase deviations of the incoming data. As proper sampling of the serial data occurs, a Recovered Bit Clock 860 is derived that corresponds in timing (phase and frequency) to the serial data signal. This Recovered Bit Clock 860 is supplied to a detector 870, such as a second order filter, that produces a Phase Control Signal 850 that is supplied to the VCDL component 820. The Phase Control Signal 850 comprises feedback information on adjusting the phase of the multiphase clocks. For example, this signal may comprise instructions that the phase needs to be increased by a fixed amount, decreased by a fixed amount, or left unchanged.

As shown in FIG. 8, the VCDL 820 includes an adjustable delay control circuit 880 that adjusts the phases of the multiphase clock and determines an injection point location. The adjustable delay control circuit 880 may be implemented using the phase control circuit 300 of FIG. 3. A first control circuit 885 determines the Recovered Bit Clock 860 from one of the adjusted phases of the multiphase clock. A detector circuit 870 is coupled to the first control circuit 885 and the VCDL 820 to determine phase control data that is supplied to the VCDL 820 in a Phase Control Signal 850. The Phase Control Signal 850 is transmitted in phase with the Recovered Bit Clock 860. As shown in FIG. 8, a second control circuit 895 coupled to the VCDL 820 determines, as a function of the injection point location, which of the rising and falling edges of the PLL clock signal to use to synchronize the Phase Control Signal 860 relative to the PLL clock. The second control circuit 895 may be implemented using the control circuit 700 of FIG. 7.

While the invention has been described with reference to the above embodiments, it will be appreciated by those of ordinary skill in the art that modifications can be made to the structure and elements of the invention without departing from the spirit and scope of the invention as a whole.

What is claimed is:

1. A method for synchronizing signals generated and used in different clock domains in a system comprising a Phase-Locked Loop (PLL) clock signal supplied to a Voltage Controlled Delay Loop (VCDL), the VCDL employing a multiphase clock, the Phase-Locked Loop (PLL) clock signal having a rising edge and a falling edge, said method comprising the steps of:
   adjusting the phases of the multiphase clock, said adjusting comprising controlling a current phase delay by determining an injection point location;
   determining a recovered clock from one of said adjusted phases of the multiphase clock;
   providing a phase control signal to the VCDL, the phase control signal being transmitted in phase with the recovered clock and comprising phase control data; and,
   determining, as a function of the injection point location, which of said rising and falling edges of the PLL clock signal to use to synchronize the phase control signal relative to the PLL clock.

2. The method of claim 1 further comprising a sampling step for obtaining the phase control data from the phase control signal by using said determined edge of the PLL clock signal as a sampling edge.

3. The method of claim 2 wherein the phase control data is chosen from a set of instructions relating to changing the current phase delay, the set consisting of increasing, decreasing and leaving the current phase delay unchanged.

4. The method of claim 3 wherein the circuit is contained in a Clock and Data Recovery (CDR) system and wherein the recovered clock is used to sample received data.

5. The method of claim 3 wherein the injection point location occurs in one of four quadrants, the quadrants consisting of quadrant 1, quadrant 2, quadrant 3 and quadrant 4.

6. The method of claim 5 wherein said sampling step comprises using a falling edge of the PLL clock signal to synchronize the phase control signal when the injection point is in quadrant 1 or quadrant 2.

7. The method of claim 5 wherein said sampling step comprises using a rising edge of the PLL clock signal to synchronize the phase control signal when the injection point is in quadrant 3 or quadrant 4.

8. The method of claim 5 further comprising the steps of:
   setting an in-phase parameter (I) to the value 1 if the injection point is in quadrant 1 or quadrant 2;
   setting I to the value 0 if the injection point is in quadrant 3 or quadrant 4;
   setting a quadrature parameter (Q) to the value 1 if the injection point is in quadrant 4 or quadrant 1;
   setting Q to the value 0 if the injection point is in quadrant 2 or quadrant 3; and,
   wherein said step of determining an edge of the PLL clock signal further comprises the step of utilizing the I and Q parameter values to thereby compensate for propagation delay skew of the phase control signal.

9. The method of claim 8 wherein said utilizing step comprises the steps of:
   using a first configuration flag to select between in-phase and quadrature decoder outputs; and
   using a second configuration flag to determine whether an inverted edge of the PLL clock signal is to be used to synchronize the phase control signal.

10. The method of claim 9 wherein at least one of the configuration flags are set by a configuration operation, the configuration operation selected from the group consisting of setting default flags, changing flags by a user, and combinations thereof.

11. A circuit for synchronizing signals generated in a first clock domain with signals generated in a second clock domain in a system comprising a Phase-Locked Loop (PLL) clock signal supplied to a Voltage Controlled Delay Loop (VCDL), the VCDL employing a multiphase clock, the Phase-Locked Loop (PLL) clock signal having a rising edge and a falling edge, said circuit comprising:
   an adjustable delay circuit for adjusting the phases of the multiphase clock, said adjusting comprising controlling a current phase delay by determining an injection point location;
   a first control circuit coupled to the adjustable delay circuit to determine a recovered clock from one of said adjusted phases of the multiphase clock;
   a detector circuit coupled to the first control circuit and the VCDL to determine phase control data that is supplied to the VCDL in a phase control signal, the phase control signal being transmitted in phase with the recovered clock; and,
   a second control circuit coupled to the VCDL to determine, as a function of the injection point location, which of said rising and falling edges of the PLL clock signal to use to synchronize the phase control signal relative to the PLL clock.

12. The circuit of claim 11 further comprising a sampling circuit coupled to the second control circuit to obtain the phase control data from the phase control signal by using said determined edge of the PLL clock signal as a sampling edge.

13. The circuit of claim 12 wherein the phase control data is chosen from a set of instructions relating to changing the current phase delay, the set consisting of increasing, decreasing and leaving the current phase delay unchanged.

14. The circuit of claim 13 wherein the circuit is contained in a Clock and Data Recovery (CDR) system and wherein the recovered clock is used to sample received data.

15. The circuit of claim 13 wherein the injection point location occurs in one of four quadrants, the quadrants consisting of quadrant 1, quadrant 2, quadrant 3 and quadrant 4.

16. The circuit of claim 15 wherein the falling edge of the PLL clock signal is used to synchronize the phase control signal when the injection point is in quadrant 1 or quadrant 2.

17. The circuit of claim 15 wherein the rising edge of the PLL clock signal is used to synchronize the phase control signal when the injection point is in quadrant 3 or quadrant 4.

18. The circuit of claim 15 further comprising a third control circuit coupled to the second control circuit to set in-phase (I) and quadrature parameter (Q) values such that:
 I is set to the value 1 if the injection point is in quadrant 1 or quadrant 2;
 I is set to the value 0 if the injection point is in quadrant 3 or quadrant 4;
 Q is set to the value 1 if the injection point is in quadrant 4 or quadrant 1;
 Q is set to the value 0 if the injection point is in quadrant 2 or quadrant 3; and,
 wherein said second control circuit utilizes said I and Q parameter values to thereby compensate for propagation delay skew of the phase control signal.

19. The circuit of claim 18 wherein said second control circuit further comprises a logic circuit such that:
 a first configuration flag is used to select between in-phase and quadrature decoder outputs; and
 a second configuration flag is used to determine whether an inverted edge of the PLL clock signal is to be used to synchronize the phase control signal.

20. The circuit of claim 19 further comprising a fourth control circuit coupled to said second control circuit to set at least one of the configuration flags by a configuration operation, the configuration operation selected from the group consisting of setting default flags, changing flags by a user, and combinations thereof.

* * * * *